(12) United States Patent
Zhang et al.

(10) Patent No.: US 9,988,710 B2
(45) Date of Patent: Jun. 5, 2018

(54) SPUTTERING TARGET AND METHOD FOR PRODUCING SAME

(75) Inventors: Shoubin Zhang, Sanda (JP); Masahiro Shoji, Sanda (JP); Keita Umemoto, Sanda (JP)

(73) Assignees: MITSUBISHI MATERIALS CORPORATION, Tokyo (JP); SOLAR FRONTIER K.K., Tokyo (JP)

( * ) Notice: Subject to any disclaimer, the term of this patent is extended or adjusted under 35 U.S.C. 154(b) by 297 days.

(21) Appl. No.: 14/352,988

(22) PCT Filed: Jul. 6, 2012

(86) PCT No.: PCT/JP2012/068033
§ 371 (c)(1),
(2), (4) Date: Apr. 18, 2014

(87) PCT Pub. No.: WO2013/065362
PCT Pub. Date: May 10, 2013

(65) Prior Publication Data
US 2014/0251801 A1 Sep. 11, 2014

(30) Foreign Application Priority Data
Nov. 1, 2011 (JP) ................................. 2011-239969

(51) Int. Cl.
*C23C 14/00* (2006.01)
*C23C 14/34* (2006.01)
(Continued)

(52) U.S. Cl.
CPC .......... *C23C 14/3414* (2013.01); *B22F 9/082* (2013.01); *C22C 1/0425* (2013.01);
(Continued)

(58) Field of Classification Search
None
See application file for complete search history.

(56) References Cited

U.S. PATENT DOCUMENTS 8,124,211 B2   2/2012   Sasa et al.
2006/0068587 A1*  3/2006  Mizuno .................... C22C 9/00
                                                          438/659
(Continued)

FOREIGN PATENT DOCUMENTS

CN   101440442 A   5/2009
CN   101906552 A   12/2010
(Continued)

OTHER PUBLICATIONS

T. F. Grigorieva, "Mechanochemical synthesis of intermetallic compounds." 2001, Russian Chemical Reviews, Issue 1 vol. 70, pp. 45-63.*

(Continued)

*Primary Examiner* — Timon Wanga
(74) *Attorney, Agent, or Firm* — Leason Ellis LLP

(57) ABSTRACT

Provided are a sputtering target which has excellent machinability and is capable of forming a compound film that mainly contains Cu and Ga and a method for producing the sputtering target. The sputtering target of the present invention has a component composition that contains 15 to 40 at % of Ga, 0.1 to 5 at % of Bi, and the balance composed of Cu and unavoidable impurities with respect to all metal elements in the sputtering target. The method for producing the sputtering target includes a step of melting at least Cu, Ga and Bi as simple substances or an alloy that contains two or more of these elements at 1,050° C. or higher to produce an ingot.

7 Claims, 3 Drawing Sheets

(51) Int. Cl.
  *C22C 9/00* (2006.01)
  *B22F 9/08* (2006.01)
  *C22C 1/04* (2006.01)
  *B22F 3/14* (2006.01)
  *B22F 9/04* (2006.01)

(52) U.S. Cl.
  CPC .................................... *C22C 9/00* (2013.01);
     *B22F 3/14* (2013.01); *B22F 2009/043* (2013.01)

(56) References Cited

U.S. PATENT DOCUMENTS

| | | | |
|---|---|---|---|
| 2008/0075884 A1 | 3/2008 | Ha et al. | |
| 2010/0307914 A1 | 12/2010 | Hiramoto et al. | |
| 2011/0089030 A1* | 4/2011 | Juliano | B22D 11/0614 204/298.13 |
| 2012/0045360 A1* | 2/2012 | Matsumura | C22C 1/0425 420/591 |
| 2012/0286219 A1* | 11/2012 | Ikisawa | C23C 14/0623 252/514 |

FOREIGN PATENT DOCUMENTS

| | | |
|---|---|---|
| CN | 102149833 A | 8/2011 |
| EP | 2420590 A1 | 2/2012 |
| JP | 2002064062 A | 2/2002 |
| JP | 2003282600 A | 10/2003 |
| JP | 2010116580 A | 5/2010 |
| JP | 2010265544 A | 11/2010 |
| JP | 2010280944 A | 12/2010 |
| TW | 200829509 A | 7/2008 |
| TW | 200912924 A | 3/2009 |
| TW | 201126003 A | 8/2011 |
| WO | WO-2011055537 A1 | 5/2011 |

OTHER PUBLICATIONS

Nakada et al.; "Impacts of SB and BI Incorporations on CIGS Thin Films and Solar Cells": IEEE; pp. 003527-003531.
Extended European Search Report for EP Application No. 12845804.9 dated Mar. 17, 2015.
Chinese Office Action dated Oct. 11, 2014, and English translation thereof, issued during the prosecution of corresponding Chinese Patent Application No. 201280003513.7.
Taiwan Office Action for Taiwan Appln. No. TW10101125083.
International Search Report for PCT/JP2012/068033.
Office Action dated May 12, 2015 for the corresponding Chinese Application No. 201280003513.7.

* cited by examiner

SPUTTERING TARGET AND METHOD FOR PRODUCING SAME

FIELD OF THE INVENTION

The present invention relates to a sputtering target for use in forming a compound film that mainly contains Cu and Ga and a method for producing the same.

DESCRIPTION OF THE RELATED ART

Conventionally, a Cu—Ga target has been used as a material essential for producing a solar cell in which a Cu—In—Ga—Se quaternary alloy film (so-called "CIGS film") is used as a light absorbing layer by a so-called selenization (Se) method. The selenization method is a method in which a Cu—Ga target is subject to sputtering of about 500 nm, a film stack subject to sputtering of about 500 nm consisting of the Cu—Ga target and an In film formed thereon is subject to heat treatment in an $H_2Se$ gas at a temperature of 500° C., and then Se is diffused into Cu—Ga—In to thereby form a Cu—In—Ga—Se compound film (see Patent Document 1).

On the other hand, in order to improve the power generation efficiency of a light absorbing layer consisting of a Cu—In—Ga—Se quaternary alloy film, the addition of Na to tire light absorbing layer is required. For example, Non-Patent Document 1 proposes the fact that Na content in a precursor film (Cu—In—Ga—Se quaternary alloy film) is typically about 0.1%.

PRIOR ART DOCUMENTS

Patent Document

[Patent Document 1] Japanese Patent No. 3249408

Non-Patent Document

[Non-Patent Document 1] A. Romeo, "Development of Thin-film Cu(In, Ga)Se2 and CdTe Solar Cells", Prog. Photovolt: Res. Appl. 2004; 12:93-111 (DOI: 10.1002/pip.527

SUMMARY OF THE INVENTION

Problems to be Solved by the Invention

The following problems still remain in the conventional techniques described above.

Specifically, since a high-Ga content Cu—Ga target with high density is very hard and exhibits poor ductility, it is difficult to subject the Cu—Ga target to surface processing by cutting, so that grinding must undesirably be used. Thus, a target processing speed is slow and it is very difficult to process the Cu—Ga target to a complex shape. A Na-doped Cu—Ga target also has the same problems as described above.

The present invention has been made in view of the aforementioned problems, and an object of the present invention is to provide a sputtering target which has excellent machinability and is capable of forming a compound film that mainly contains Cu and Ga and a method for producing the same.

Means for Solving the Problems

The present inventors have studied the method for producing a sputtering target for a compound film that mainly contains Cu and Ga. Consequently, the present inventors have found that the machinability of the sputtering target can be improved with small addition of Bi.

Thus, the present invention has been made on the basis of the finding, and adopts the following configuration in order to overcome the aforementioned problems. Specifically, a sputtering target according to a first aspect of the present invention is characterized in that the sputtering target has a component composition containing 15 to 40 at % of Ga, 0.1 to 5 at % of Bi, and the balance composed of Cu and unavoidable impurities with respect to all metal elements in the sputtering target.

Since the sputtering target according to the first aspect of the present invention contains 0.1 to 5 at % of Bi, the sputtering target can have high machinability even if the sputtering target is produced with high density.

The reason why the amount of Bi added is set within the above range is because, if the amount of Bi added is less than 0.1 at %, the machinability improving effect of the sputtering target cannot be obtained and whereas if the amount of Bi added exceeds 5 at %, the sputtering target is susceptible to embrittlement, resulting in the readily occurrence of cracking or chipping during cutting processing.

The reason why the content of Ga is set in the range of 15 to 40 at % is because the content of Ga in the above range is the typical amount of Ga added in order to form a CIGS light absorbing layer having high conversion efficiency as disclosed in Patent Document 2.

A sputtering target according to a second aspect of the present invention is characterized in that the sputtering target according to the first aspect of the present invention has a structure containing a Bi metal simple substance or an intermetallic compound containing 10 at or greater of Bi within crystal grains or grain boundaries of an alloy phase mainly containing a Cu—Ga alloy.

Specifically, since the sputtering target according to the second aspect of the present invention has a structure containing a Bi metal element simple substance or an intermetallic compound containing 10 at % or greater of Bi within crystal grains or grain boundaries (hereinafter, may be abbreviated as "grain boundaries or the like") of an alloy phase mainly containing a Cu—Ga alloy, free-machinability can be exhibited due to the presence of a Bi metal element simple substance or an intermetallic compound containing 10 at % or greater of Bi within grain boundaries or the like, resulting in an improvement in machinability. In general, up to about 0.5 at % of Bi is dissolved as a solid solution in Cu and up to about 0.2 at % of Bi is dissolved as a solid solution in Ga. However, according to the present research, the presence of a Bi metal simple phase or an intermetallic compound containing 10 at % or greater of Bi is more effective than a solid solution containing about 0.5 at % of Bi in order to improve the free-machinability of the alloy.

A sputtering target according to a third aspect of the present invention is characterized in that the intermetallic compound containing 10 at % or greater of Bi is $Cu_5Bi_2$ in the sputtering target material according to the second aspect of the present invention.

The present inventors have found that, when Bi is added, the presence of $Cu_5Bi_2$ in the sputtering target material affects the machinability of the sputtering target. Specifically, the present inventors have found that, if a Bi is contained in the sputtering target in the state of $Cu_5Bi_2$, the occurrence of chipping or cracking may be reduced during machining to the sputtering target.

A sputtering target according to a fourth aspect of the present invention is characterized in that the average grain diameter of the metal phase in the sputtering target material is 100 µm or less according to any one of the first to third aspects of the present invention.

Specifically, since, in the sputtering target, chipping or cracking may easily occur on the target along grain boundaries during processing and the improvement effect of free-machinability obtained by the addition of Bi is reduced if the average grain diameter of the metal phase exceeds 100 µm, the average grain diameter of the metal phase is set to 100 µm or less.

A sputtering target according to a fifth aspect of the present invention is characterized in that the average grain diameter of the Bi-containing phase in the sputtering target material is 80 µm or less according to any one of the first to fourth aspects of the present invention.

Specifically, since, in the sputtering target, the average grain diameter of the Bi-containing phase is adjusted to relatively small size, the Bi-containing phase is readily concentrated on the grain boundaries in the Cu—Ga green body, so that cracking at grain boundaries during processing can be effectively prevented. Furthermore, the Bi-containing phase is reduced in size and the Bi-containing phase which has a low melting point and is markedly softer than the Cu—Ga green body is uniformly distributed in the target material, so that the effect of lubricating a cutting tool and the target surface during cutting can be realized. If the Bi-containing phase has a size greater than 80 µm, the difference in machinability between the phase consisting of Cu and Ga having a relatively high melting point and high hardness and the Bi-containing phase having a low melting point and low hardness in the target structure appears significantly during cutting, resulting in an undesirable increase in surface roughness of the target.

Note that the average grain diameter of the metal phase and the Bi-containing phase is defined as an average of long diameters of circumscribed rectangulars of particles.

A sputtering target according to a sixth aspect of the present invention is characterized in that Na is contained as an NaF compound, an $Na_2S$ compound, or an $Na_2Se$ compound and Na is contained in 0.05 to 15 at % with respect to all metal elements in the sputtering target according to any one of the first to fifth aspects of the present invention.

Specifically, since, in the sputtering target, Na is further contained as an NaF compound, an $Na_2S$ compound, or an $Na_2Se$ compound and Na is contained in 0.05 to 15 at % with respect to all metal, elements in the sputtering target, a Cu—Ga film containing Na which is effective for the improvement in power generation efficiency may be formed. It should be noted that fluorine (F) and sulfur (S) entrapped in a Cu—Ga film containing Na do not particularly affect the characteristics of the light absorbing layer of a solar cell.

Here, the reason why the Na content is set within the above range is as follows. If the amount of Na added exceeds 15 at %, the adhesion between a Cu—Ga film containing Na and an Mo electrode serving as a base layer becomes significantly weak, resulting in the occurrence of film separations during a subsequent selenization process. On the other hand, if the amount of Na added is less than 0.05 at %, the effect of improving power generation efficiency may not be obtained. It should be noted that the Na content in the sputtering target is preferably in the range of 0.1 at % to 0.5 at %.

A method for producing a sputtering target according to a seventh aspect of the present invention is a method for producing the sputtering target according to any one of the first to fifth aspects of the present invention and is characterized in that the method includes a step of melting at least Cu, Ga and Bi as simple substances or an alloy that contains two or more of these elements at 1050° C. or higher to produce an ingot.

Specifically, since, in the method for producing the sputtering target, the starting material is melted at 1050° C. or higher, Ga and Bi can be surely and uniformly distributed in the ingot structure, the cutting processability of the sintered body can be improved uniformly as a whole.

A method for producing a sputtering target according to an eighth aspect of the present invention is a method for producing the sputtering target according to any one of the first to fifth aspects of the present invention and is characterized in that the method includes a step of producing a starting material powder that is obtained by pulverizing at least Cu, Ga and Bi as simple substances or an alloy that contains two or more of these elements; and a step of subjecting the starting material powder to hot processing in a vacuum, in an inert atmosphere or in a reducing atmosphere, wherein Ga contained in the starting material powder is contained in the form of a Cu—Ga alloy or in the form of a Ga—Bi alloy.

A method for producing a sputtering target according to a ninth aspect of the present invention is a method for producing the sputtering target according to a sixth aspect of the present invention and is characterized in that the method includes a step of producing a starting material powder that is obtained by preparing at least Cu, Ga and Bi as simple substances or an alloy that contains two or more of these elements as metal powder and mixing the metal powder with a NaF powder, a $Na_2S$ powder, or a $Na_2Se$ powder; and a step of subjecting the starting material powder to hot processing in a vacuum, in an inert atmosphere or in a reducing atmosphere, wherein Ga contained in the starting material powder is contained in the form of a Cu—Ga alloy or in the form of a Ga—Bi alloy.

Specifically, since, in the method for producing these sputtering target, Ga contained in the starting material powder is contained in the form of a Cu—Ga alloy or in the form of a Ga—Bi alloy, Ga in a sintered body structure can surely be alloyed as compared with a case where only metal Ga is contained in the starting material powder, resulting in an improvement in cutting processability of a sintered body.

Effects of the Invention

According to the present invention, the following effects may be provided.

Specifically, according to the sputtering target of the present invention and the method for producing the same, the sputtering target contains 0.1 to 5 at % of Bi, and thus, the sputtering target can have high machinability even if the sputtering target is produced with high density. Thus, in the sputtering target of the present invention, it becomes easy to subject the sputtering target to surface processing by cutting, so that a sputtering target processing speed is fast and it also becomes easy to process the sputtering target to a complex shape. Also, a Bi-containing Cu—Ga film can be formed by using the sputtering target of the present invention by the sputtering method.

BEST MODE FOR CARRYING OUT THE INVENTION

Figure 1:
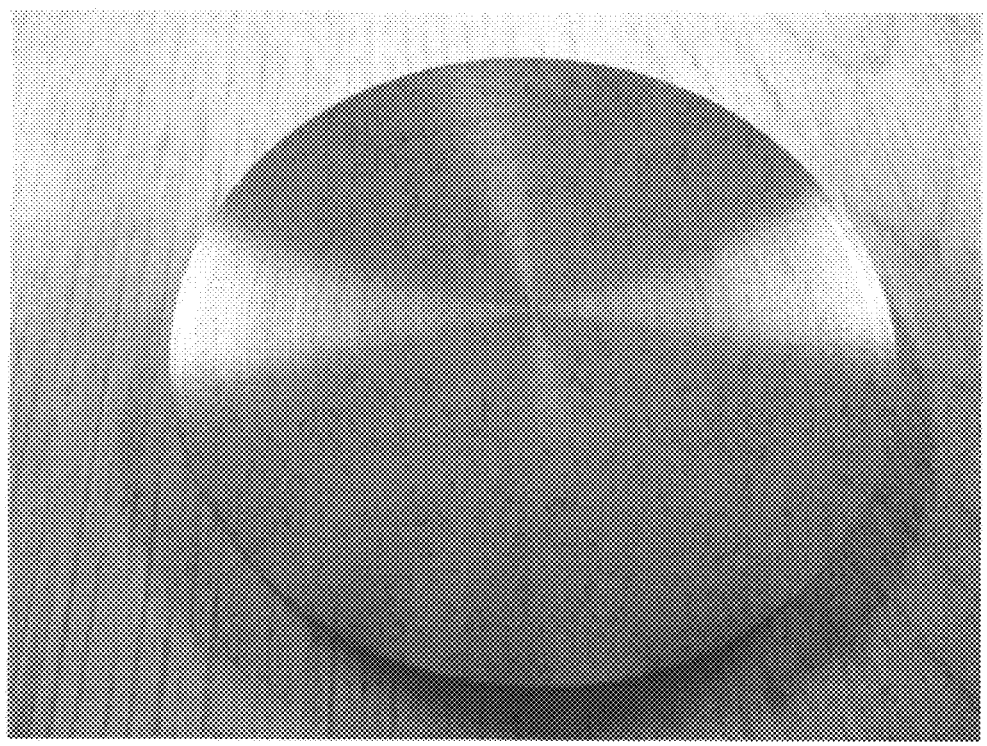
FIG. 1 is a photograph illustrating the processed target surface in Example 6 of the sputtering target and the method for producing the same according to the present invention.

Hereinafter, a description will be given of a sputtering target and a method for producing the same according to one embodiment of the present invention.

The sputtering target of the present embodiment has a component composition containing 15 to 40 at % of Ga, 0.1 to 5 at % of Bi, and the balance composed of Cu and unavoidable impurities with respect to all metal elements in the sputtering target.

Also, the sputtering target of the present embodiment has a structure containing at least one of a Bi simple substance or an intermetallic compound containing 10 at % or greater of Bi within crystal grains or grain boundaries of an alloy phase mainly containing a Cu—Ga alloy.

Furthermore, the intermetallic compound containing 10 at % or greater of Bi contains $Cu_5Bi_2$.

It is preferable that the average grain diameter of the metal phase in the sputtering target material is 100 μm or less. Furthermore, it is preferable that the average grain diameter of the Bi-containing phase in the sputtering target material is 80 μm or less.

Note that Bi is a metal that is relatively hardly pulverized into fine particles. When a Bi powder is produced by the pulverization of a Bi ingot, the Bi powder typically has a size of a few hundreds of μm. According to the research of the present invention, when the average grain diameter of the Bi phase in the target structure is 80 μm or less, damage on the target surface is reduced during cutting processing, resulting in obtaining a flat processed surface.

Furthermore, it is preferable that, in a Bi simple substance or a Bi-based intermetallic compound, the number of phases having a grain diameter (inscribed circle-equivalent diameter) of 0.3 μm or greater lathe area of 200 μm×150 μm is three or greater. Note that a Bi simple substance or a Bi-based intermetallic compound and its grain diameter dispersed within crystal grains or grain boundaries of an alloy phase mainly containing a Cu—Ga alloy can be measured by Cu, Ga, and Bi element mapping images using, for example, an electron probe microanalyzer (EPMA).

Furthermore, in the sputtering target of the present embodiment, it is preferable that Ga in the sputtering target material is contained in the form of a Cu—Ga binary alloy. Specifically, Ga is not present in the sputtering target material as a simple substance, resulting in an improvement in machinability of the sputtering target. The presence/absence of a Ga simple substance and the presence/absence of a Cu—Ga alloy can be determined by, for example, X-ray diffraction (XRD) measurement of the sputtering target.

Specifically, after polishing of the surfaces of these sputtering targets (Ra: 5 μm or less), XRD measurement is performed, so that the presence of a Ga simple substance can be determined by peaks at around θ of 15.24° (orientation: 111), 22.77° (113), and 23.27° (202) belonging to the Ga simple substance. The presence/absence of a Cu—Ga alloy can be determined by a standard diffraction curve card using XRD measurement by the same method as in the above-described method.

Examples of a method for forming a Ga alloy In the sputtering target material include a method for adding Ga which is the starting material for the sputtering target to a starting material powder as a Cu—Ga alloy or a Cu—Ga intermetallic compound or as a Ga—Bi alloy or a Ga—Bi intermetallic compound, a method for forming an alloy by dissolving the starting materials Cu, Ga, and Bi together, and the like.

It should be noted that, in the sputtering target of the present embodiment, Na may be contained as an NaF compound, an $Na_2S$ compound, or en $Na_2Se$ compound and Na may be contained in 0.05 to 15 at % with respect to all metal elements in the sputtering target.

For composition evaluation of the metal elements, quantitative analysis is carried out using an ICP method (high frequency induction coupled plasma method) by pulverizing the sputtering target.

As a method for producing the sputtering target of the present embodiment, a dissolution casting method and a powder sintering method may be employed.

The dissolution casting method includes a step of melting at least Cu, Ga, and Bi as simple substances or an alloy that contains two or more of these elements at 1,050° C. or higher to produce an ingot and a step of subjecting the obtained ingot to rolling as appropriate so as to produce a sputtering target.

Note that the melting point of the Cu—Ga—Bi-based alloy containing 15 at % or greater of Ga and 0.1 at % or greater of Bi is 1000° C. or lower. The reason why the melting temperature is set to 1050° C. or higher is because, if the melting temperature is set to lower than 1050° C., the viscosity of the molten mixture of Cu, Ga, and Bi is high, resulting in a difficulty in obtaining a uniform mixture of the melted elements. Specifically, the Bi-containing phase in the obtained ingot becomes difficult in micronization, resulting in an undesirable increase in a rate of occurrence of chipping or cracking during processing of the target. Thus, the melting temperature is set to 1050° C. or higher.

The powder sintering method includes a step of producing a starting material powder that is obtained by pulverizing at least Cu, Ga and Bi as simple substances or an alloy that contains two or more of these elements; and a step of subjecting the starting material powder to ho processing such as sintering by hot pressing (HP) or hot isostatic pressing (HIP) in a vacuum, in an inert gas atmosphere or in a reducing atmosphere. As another hot processing step, a step of subjecting the produced starting material powder to hot processing such as sintering in an unpressurized state such as in a vacuum, in an inert gas atmosphere at a pressure of from 0.01 kgf/cm² to 10 kgf/cm², or in a reducing atmosphere after pressure molding of the produced starting material powder may also be employed. It is preferable that Ga contained in the starting material powder is contained in the form of a Cu—Ga alloy or in the form of a Ga—Bi alloy.

It is preferable that sintering using the hot pressing method is performed at a hot pressing temperature (retention temperature during hot pressing) in the range of from 500° C. to 900° C. The reason why a hot pressing temperature is set within the above range is as follows. If the hot pressing temperature is less than 500° C., the density of the sintered body becomes low, and thus, chipping may easily occur on the sintered body during cutting processing. On the other hand, if the hot pressing temperature exceeds 900° C., the average grain diameter of the Cu—Ga phase increases during hot pressing, resulting in processing defects.

It is preferable that sintering using the HIP method is performed at a HIP temperature (retention temperature during HIP pressing) in the range of from 400° C. to 900° C. The reason why an HIP temperature is set within the above range is as follows. If the HIP temperature is less than 400° C., the density of the sintered body becomes low, and thus, chipping may easily occur on the sintered body during cutting processing. On the other hand, if the HIP temperature exceeds 900° C., the average grain diameter of the Cu—Ga phase increases during HIP pressing, resulting in processing defects.

It is preferable that sintering using a method for sintering the resulting molded object in vacuum, in an inert atmosphere, or in a reducing atmosphere after pressure molding of the starting material powder is performed at a sintering temperature (retention temperature during sintering) in the range of from 550° C. to 900° C. The reason why a sintering temperature is set within the above range is as follows. If the sintering temperature is less than 550° C., the density of the sintered body becomes low, and thus, chipping may easily occur on the sintered body during cutting processing. On the other hand, if the sintering temperature exceeds 900° C., the average grain diameter of the Cu—Ga phase increases, resulting in processing defects.

A starting material powder for use in hot processing is produced by any one of the following methods (a) to (d).

(a) A predetermined total amount of Cu—Ga—Bi is atomized by an atomizing device so as to produce a Cu—Ga—Bi atomized powder as a starting material powder. Note that, when Na is added, a predetermined amount of a NaF powder, a NS powder, or a $Na_2Se$ powder is mixed with the starting material powder.

(b) A predetermined total amount of Cu—Ga is atomized by an atomizing device so as to produce a Cu—Ga atomized powder. Furthermore, a Bi powder is mixed with the Cu—Ga atomized powder so as to obtain a starting material powder having a predetermined composition. Note that, when Na is added, a predetermined amount of a NaF powder, a $Na_2S$ powder, or a $Na_2Se$ powder is mixed with the starting material powder.

(c) A Cu—Ga—Bi atomized powder is produced by an atomizing device. Furthermore, a Cu—Ga powder, a Cu powder, or a Bi powder (or an intermetallic compound of Cu and Bi) is added to the Cu—Ga—Bi atomized powder so as to obtain a powder mixture having a predetermined composition. Note that, when Na is added, a predetermined amount of a NaF powder, a $Na_2S$ powder, or a $Na_2Se$ powder is mixed with the starting material powder.

(d) A predetermined total amount of Cu—Ga—Bi is melted and casted to obtain an ingot. Then, the resulting ingot is pulverized to thereby obtain a powder which is used as a starting material powder. Note that, when Na is added, a predetermined amount of a NaF powder, a $Na_2S$ powder, or a $Na_2Se$ powder is mixed with the starting material powder. Alternatively, a predetermined total amount of Cu—Ga is melted and casted to obtain an ingot. The resulting ingot is pulverized to obtain a powder. Then, a Bi powder or an intermetallic compound powder of Cu and Bi is added to the resulting powder so as to obtain a powder mixture.

Next, the starting material powder produced by any one of the methods (a) to (d) is subject to hot processing by a method such as hot pressing, HIP (hot isostatic pressing), or sintering a molded object after pressure molding of the starting material powder. Also, in order to prevent oxidization of a Cu—Ga alloy or Cu, such hot processing is carried out in a vacuum, in an inert gas atmosphere, or in a reducing gas atmosphere. The pressure applied during hot pressing or HIP may greatly affect the density of the sputtering target sintered body, and thus, the pressure to be applied during hot pressing is preferably in the range of from 100 $kgf/cm^2$ to 500 $kgf/cm^2$. The pressure to be applied during HIP is preferably in the range of from 500 $kgf/cm^2$ to 1,500 $kgf/cm^2$. Also, pressurization may be performed prior to the start of the elevation of temperature for sintering or may be applied after a certain temperature is reached.

Next, since a Bi-containing Cu—Ga sintered body (or Bi and Na-containing Cu—Ga sintered body) sintered by the hot processing exhibits excellent machinability, the Bi-containing Cu—Ga sintered body is processed into a specified shape of a sputtering target using cutting processing. Next, the processed sputtering target is bonded to a backing plate consisting of Cu or Cu alloy using In as a solder, and the resulting target is provided to sputtering.

In order to prevent oxidization and moisture absorption of the processed sputtering target from being occurred, the entire sputtering target is preferably stored in a vacuum pack or a pack purged with inert gas.

The thus produced sputtering target of the present embodiment is subject to sputtering in Ar gas by a direct-current (DC) magnetron sputtering method. For the direct-current sputtering, a pulse superimposing power supply for applying a pulse voltage or a non-pulse DC power supply may also be employed.

As described above, according to the sputtering target of the present embodiment, the sputtering target contains 0.1 to 5 at % of Bi, and thus can have high machinability even if the sputtering target is produced with high density. In particular, since the sputtering target has a structure containing a Bi metal simple substance or an intermetallic compound containing 10 at % or greater of Bi within crystal grains or grain boundaries of an alloy phase mainly containing a Cu—Ga alloy, the presence of a Bi simple substance or a Bi-based intermetallic compound within grain boundaries or the like not only reduces the bonding strength between crystal grains but also serves as a lubricating material during cutting, resulting in an improvement in machinability.

Also, Ga in the sputtering target material is contained in the form of a Cu—Ga binary alloy. Specifically, Ga is contained in the form of a Cu—Ga solid solution or an intermetallic compound, so that a working surface suitable for sputtering can be realized without the occurrence of chipping or cracking during cutting processing after sintering.

Furthermore, the presence of $Cu_5Bi_2$ in the sputtering target material affects the machinability of the sputtering target, so that the occurrence of chipping or cracking is further reduced during machining.

Also, when Na is contained as an NaF compound, an $Na_2S$ compound, or an $Na_2Se$ compound and Na is contained in 0.05 to 15 at % with respect to all metal elements in the sputtering target, a Cu—Ga film containing Na which is effective for the improvement in power generation efficiency may be formed by the sputtering method. It should be noted that fluorine (F) and sulfur (S) entrapped in a Cu—Ga film containing Na do not particularly affect the characteristics of the light absorbing layer of a solar cell.

EXAMPLES

Next, the sputtering target of the present invention and a method for producing the same will be specifically described with reference to the evaluation result of the actually produced sputtering target by way of Examples, based on the aforementioned embodiment.

(Production of Starting Material Powder)

Firstly, as the starting material powder in Examples 1, 2, 3, 5, 6, 9, and 10, the total amounts of Cu, Bi, and Ga metals were loaded into an atomizing device and were heated to 1150° C. so as to obtain the composition in Table 1. After confirming the fact that all metals became molten, the resulting molten metal was atomized by the atomizing device to thereby produce a Cu—Ga—Bi atomized powder.

As the starting material powder in Example 4, the total amounts of Bi and Ga and a half amount of Cu were loaded into an atomizing device and were heated to 1150° C. so as to obtain the composition in Table 1. After confirming the fact that all metals became molten, the resulting molten metal was atomized by the atomizing device to thereby produce a Cu—Ga—Bi atomized powder. Next, a Cu powder having an average grain diameter of 2 μm or less was added to the obtained Cu—Ga—Bi atomized powder, and the resulting mixture was mixed by dry ball milling (ZrO$_2$ ball having a diameter of 5 mm, ball/metal powder weight ratio=3:1) for four hours to thereby produce a powder mixture of Cu, Ga, and Bi having a predetermined composition. Note that dry ball milling was used under the same conditions in Examples and Comparative Examples.

As the starting material powder in Example 7, the total amounts of Cu, Bi, and Ga were loaded into a vacuum melting furnace and were heated to 1150° C. so as to obtain the composition in Table 1. After confirming the fact that all metals became molten, the resulting metal molten was poured into a water-cooled casting mold to thereby produce an ingot consisting of Cu, Ga, and Bi. Next, the obtained Cu—Ga—Bi ingot was pulverized into a powder having an average grain diameter of 30 μm to thereby produce a powder mixture of Cu, Ga, and Bi having a predetermined composition.

As the starting material powder in Examples 8 and 11, Cu and Ga starting materials were firstly loaded into an atomizing device and were heated to 1150° C. After confirming the fact that all metals became molten, the resulting molten metal was atomized by the atomizing device to thereby produce a Cu—Ga atomized powder. Next, the obtained Cu—Ga atomized powder was mixed with a Bi metal powder having an average grain diameter of 44.5 μm by dry ball milling for four hours to thereby produce a powder mixture of Cu, Ga, and Bi so as to obtain a predetermined composition in Table 1.

As the starting material powder in Examples 12 and 13, the total amounts of Cu, Bi, and Ga were loaded into a vacuum melting furnace and were heated to 1200° C. so as to obtain the composition in Table 1. After confirming the fact that all metals became molten, the resulting metal molten was poured into a water-cooled casting mold (described as "quenched" in Table 3) to thereby produce an ingot consisting of Cu, Ga, and Bi. Furthermore, the ingot in Example 12 was subject to hot-rolling at 800° C. Note that the reduction ratio (thickness before rolling/thickness after rolling×100%) in the thickness direction of the ingot is 200%. After rolling, the rolled ingot was subject to annealing for one hour at 750° C.

As the starting material powder in Example 14, the total amounts of Cu and Ga metals were firstly loaded into an atomizing device according to the composition in Table 1 and were heated to 1150° C. After confirming the fact that all, metals became molten, the resulting molten metal was atomized by the atomizing device to thereby produce a Cu—Ga atomized powder. Next, the pulverized Bi powder having an average grain diameter of 65 μm and a NaF powder having an average grain diameter of 1 μm or less were added to the obtained Cu—Ga atomized powder and the resulting mixture was mixed by dry ball milling for eight hours to thereby produce a powder mixture in Table 1.

As the starting material powder in Example 15, an atomized powder consisting of Cu, Ga, and Bi having an atomic ratio of Cu:Ga:Bi of 84.8:15:0.2 was firstly prepared. Next, a Cu—Ga atomized powder having an atomic ratio of Cu:Ga of 85:15 and having an average grain diameter of 32 μm and a NaF powder having an average grain diameter of 1 μm or less were added to the obtained. Cu—Ga—Bi atomized powder so as to obtain the composition in Table 1, and the resulting mixture was mixed by dry ball milling for eight hours to thereby produce a powder mixture in Table 1.

As the starting material powder in Examples 16 to 18, the total amounts of Cu, Ga, and Bi metals were loaded into an atomizing device according to the composition in Table 1 and were heated to 1150° C. After confirming the fact that all metals became molten, the resulting molten metal was atomized by the atomizing device to thereby produce a Cu—Ga—Bi atomized powder. Next, a NaF, a Na$_2$S, or a Na$_2$Se powder having an average grain diameter of 1 μm or less was added to the obtained Cu—Ga—Bi atomized powder, and the resulting mixture was mixed by dry ball milling for eight hours to thereby produce a powder mixture in Table 1.

Comparative Example

As the starting material powder in Comparative Examples 1 to 3 of the present invention, the total amounts of Cu and Ga metals were loaded into an atomizing device and were heated to 1150° C. so as to obtain the composition in Table 2. After confirming the fact that all metals became molten, the resulting molten metal was atomized by the atomizing device to thereby produce a Cu—Ga atomized powder in Table 2.

As the starting material powder in Comparative Example 4 of the present invention, the total amounts of Cu, Ga, and Bi metals were loaded into a vacuum melting furnace and were heated to 1150° C. After confirming the fact that all metals became molten, the resulting metal molten was poured into a graphite casting mold and was cooled to 200° C. in a vacuum furnace to thereby produce an ingot consisting of Cu, Ga, and Bi. Note that no rolling was conducted.

As the starting material powder in Comparative Examples 5, 8, 10, and 11 of the present invention, the total amounts of Cu, Ga, and Bi metals were loaded into an atomizing device and were heated to 1150° C. so as to obtain the composition in Table 2. After confirming the fact that all metals became molten, the resulting molten metal was atomized by the atomizing device to thereby produce a Cu—Ga—Bi atomized powder in Table 2.

As the starting material powder in Comparative Example 6 of the present invention, the total amounts of Cu and Ga metals were firstly loaded into an atomizing device and were heated to 1150° C. After confirming the fact that all metals became molten, the resulting molten metal was atomized by the atomizing device to thereby produce a Cu—Ga atomized powder. Next, the pulverized Bi powder having an average grain diameter of 500 μm was added to the obtained Cu—Ga atomized powder and the resulting mixture was mixed by dry ball milling for eight hours to thereby produce a powder mixture in Table 2.

As the starting material powder in Comparative Example of the present invention, the total amounts of Cu, Bi, and Ga metals were loaded into a vacuum melting furnace and were heated to 1200° C. so as to obtain the composition in Table 1. After confirming the fact that all metals became molten, the resulting metal molten was poured into a water-cooled casting mold (described as "quenched" in Table 4) to thereby produce an ingot consisting of Cu, Ga, and Bi. Note that no rolling was conducted.

As the starting material powder in Comparative Example 9 of the present invention, the total amounts of Cu and Ga metals were firstly loaded into an atomizing device according to the composition in Table 2 and were heated to 1150° C. After confirming the fact that all metals became molten, the resulting molten metal was atomized by the atomizing device to thereby produce a Cu—Ga atomized powder. Next, the pulverized Bi powder having an average grain diameter of 200 μm and a NaF powder having an average grain diameter of 1 μm or less were added to the obtained Cu—Ga atomized powder, and the resulting mixture was mixed by dry ball milling for eight hours to thereby produce a powder mixture in Table 1.

As the starting material powder in Comparative Example 12 of the present invention, the total amounts of Cu and Ga metals were loaded into an atomizing device and were heated to 1150° C. After confirming the fact that all metals became molten, the resulting molten metal was atomized by the atomizing device to thereby produce a Cu—Ga atomized powder. Next, a Bi metal powder having an average grain diameter of 30 μm and a $Na_2S$ powder having an average grain diameter of 1 μm or less were added to the obtained Cu—Ga atomized powder, and the resulting mixture was mixed by dry ball milling for four hours to thereby produce a powder mixture in Table 2.

As the starting material powder in Comparative Example 13 of the present invention, the total amounts of Cu, Ga, and Bi metals were loaded into an atomizing device and were heated to 1150° C. After confirming the fact that all metals became molten, the resulting molten metal was atomized by the atomizing device to thereby produce a Cu—Ga—Bi atomized powder. Next, a $Na_2Se$ powder having an average grain diameter of 1 μm or less was added to the obtained Cu—Ga—Bi atomized powder, and the resulting mixture was mixed by dry ball milling for four hours to thereby produce a powder mixture in Table 2.

(Production and Evaluation of Sputtering Target)

As described above, these produced starting material powder in Examples and Comparative Examples were used to thereby produce sputtering targets each having a diameter of 80 mm and a thickness of 6 μm by using the vacuum hot pressing method, the HIP method, the atmosphere sintering method after pressure molding (a mixed gas of 20% hydrogen and 80% nitrogen of two atmospheric pressure was used as the atmosphere during sintering), or the casting method as shown in Tables 3 and 4. The dimension and the density of each of the obtained target were calculated and the results calculated as the theoretical density ratio were described in Tables 3 and 4.

For calculation of theoretical density, the density of a defect-free ingot obtained by melting and slowly cooling the metal phase of Cu, Ga, and Bi in the target is used as the theoretical density of the Cu—Ga—Bi alloy having the above composition. Then, the ratio (target density/theoretical density×100%) of the density of the target to the theoretical density is set as a theoretical density ratio. When NaF, $Na_2S$, or $Na_2Se$ is added, its volume traction is calculated by using the amount of each of these compound phases added.

The theoretical density of the metal phase in the sintered body and the theoretical density of Na compound were calculated, and the theoretical, density ratio was calculated by using the ratio of the size/density of the target to each of the theoretical density of the metal phase and the theoretical density of Na compound.

Furthermore, the structure observation and X-ray diffraction measurement of each target were performed and quantitative analysis for Ga content, Bi content, and Na content which are metal components contained in the target was carried out using an ICP method (high frequency induction coupled plasma method). Also, the presence/absence of chipping after processing and the surface roughness (Ra: arithmetic mean roughness, Rz: ten-point mean roughness) of each target were measured for evaluating the processability and cutting effect of the target. The results are shown in Tables 5 and 6.

The structure observation of the sputtering targets was performed as follows. The fragment of the sintered sputtering target was embedded with a resin and was then subject to wet polishing so as to obtain a flat surface. Then, the surface distribution (MAPPING) of Cu, Ga, and Bi elements was measured by using an EPMA (electron probe microanalyzer: manufactured by JEOL JXA-8500F). The observation conditions were as follows: an accelerating voltage of 15 kV, an irradiation current of 50 nA, a scan type of single direction, a pixel (X, Y) of (240, 180), a spot size (X, Y) of (0.1 μm, 0.1 μm), and a measurement time of 10 mS. Also, element distribution (mapping) was measured several times in the area of 200×150 μm in an observation magnification of 2,000. The presence/absence of a structure (hereinafter referred to as "intervening Bi phase") including at least one of a Bi simple substance or a Bi-based intermetallic compound within crystal grains or grain boundaries of en alloy phase mainly containing a Cu—Ga alloy was confirmed by the obtained mapping image. Furthermore, the number of particles of the intervening Bi phase having an inscribed circle-equivalent diameter of 0.1 μm or greater was measured by using the Bi composition distribution diagram. The abovementioned results were described in Tables 5 and 6.

The method for evaluating processability and cutting effect was performed as follows. Firstly, Cu—Ca sintered bodies or Cu—Ga—Bi sintered bodies in Examples or Comparative Examples were subject to dry processing using a MS850G lathe manufactured by MORI SEIKI CO., LTD. The sintered bodies had a size with a diameter of φ 80 mm and a thickness of 6 mm. The rotational speed during processing was 140 rpm, the amount of cutting by the cutting tool was 0.3 mm, and the feed speed was 0.097 mm/rev. The used cutting tool (manufactured by MITSUBISHI MATERIALS CORPORATION) has a shape model number of STFER1616H16, an insert shape model number of TEGX160302L, and a material type of HTi10. Then, the surface having a thickness of 0.5 mm was cut from each sintered body to thereby evaluate the surface of the sintered body. Specifically, surface roughness measurement and confirmation of the presence/absence of chipping of the processed surface were performed at the position 20 mm apart from the central portion of the processed sintered body. Note that the surface roughness measuring device was surftest SV-3000 manufactured by Mitsutoyo and the evaluation length was 4 mm. The presence/absence of chipping was determined by taking a photograph in the area of 22 cm² using a low magnification optical microscope so as to determine the presence/absence of chipping having an inscribed circle-equivalent diameter of 0.3 mm or greater.

TABLE 1

CONTENT (at %) OF EACH METAL WITH RESPECT TO TOTAL AMOUNT OF METAL ELEMENTS (EXCLUDING Se) IN STARTING MATERIAL

| | Ga | Bi | Na (ADDED AS NaF) | Na (ADDED AS Na$_2$S) | Na (ADDED AS Na$_2$Se) | Cu |
|---|---|---|---|---|---|---|
| EXAMPLE 1 | 15.0 | 0.10 | — | — | — | REMAINING |
| EXAMPLE 2 | 20.0 | 0.50 | — | — | — | REMAINING |
| EXAMPLE 3 | 25.0 | 0.10 | — | — | — | REMAINING |
| EXAMPLE 4 | 25.0 | 3.00 | — | — | — | REMAINING |
| EXAMPLE 5 | 30.0 | 0.30 | — | — | — | REMAINING |
| EXAMPLE 6 | 30.0 | 1.00 | — | — | — | REMAINING |
| EXAMPLE 7 | 30.0 | 3.00 | — | — | — | REMAINING |
| EXAMPLE 8 | 35.0 | 2.00 | — | — | — | REMAINING |
| EXAMPLE 9 | 35.0 | 3.00 | — | — | — | REMAINING |
| EXAMPLE 10 | 40.0 | 5.00 | — | — | — | REMAINING |
| EXAMPLE 11 | 40.0 | 2.90 | — | — | — | REMAINING |
| EXAMPLE 12 | 25.0 | 0.30 | — | — | — | REMAINING |
| EXAMPLE 13 | 30.0 | 1.00 | — | — | — | REMAINING |
| EXAMPLE 14 | 20.0 | 0.50 | 0.50 | — | — | REMAINING |
| EXAMPLE 15 | 30.0 | 0.50 | 3.00 | — | — | REMAINING |
| EXAMPLE 16 | 35.0 | 0.50 | 10.00 | — | — | REMAINING |
| EXAMPLE 17 | 35.0 | 0.50 | — | 0.50 | — | REMAINING |
| EXAMPLE 18 | 38.0 | 0.50 | — | — | 0.50 | REMAINING |

TABLE 2

CONTENT (at %) OF EACH METAL WITH RESPECT TO TOTAL AMOUNT OF METAL ELEMENTS (EXCLUDING Se) IN STARTING MATERIAL

| | Ga | Bi | Na (ADDED AS NaF) | Na (ADDED AS Na$_2$S) | Na (ADDED AS Na$_2$Se) | Cu |
|---|---|---|---|---|---|---|
| COMPARATIVE EXAMPLE 1 | 35.0 | 0.00 | — | — | — | REMAINING |
| COMPARATIVE EXAMPLE 2 | 30.0 | 0.00 | — | — | — | REMAINING |
| COMPARATIVE EXAMPLE 3 | 25.0 | 0.00 | — | — | — | REMAINING |
| COMPARATIVE EXAMPLE 4 | 25.0 | 0.00 | — | — | — | REMAINING |
| COMPARATIVE EXAMPLE 5 | 30.0 | 0.01 | — | — | — | REMAINING |
| COMPARATIVE EXAMPLE 6 | 30.0 | 5.50 | — | — | — | REMAINING |
| COMPARATIVE EXAMPLE 7 | 30.0 | 0.05 | — | — | — | REMAINING |
| COMPARATIVE EXAMPLE 8 | 35.0 | 7.00 | — | — | — | REMAINING |
| COMPARATIVE EXAMPLE 9 | 20.0 | 6.50 | 1.00 | — | — | REMAINING |
| COMPARATIVE EXAMPLE 10 | 35.0 | 0.07 | — | — | — | REMAINING |
| COMPARATIVE EXAMPLE 11 | 30.0 | 11.00 | — | — | — | REMAINING |
| COMPARATIVE EXAMPLE 12 | 35.0 | 0.07 | — | 2.00 | — | REMAINING |
| COMPARATIVE EXAMPLE 13 | 38.0 | 0.06 | — | — | 1.00 | REMAINING |

TABLE 3

| | SINTERING METHOD | *1 PRESSURE (kgf/cm²) | *2 SINTERING TEMPERATURE (° C.) | *3 SINTERING TIME (H) | TARGET DENSITY (%) |
|---|---|---|---|---|---|
| EXAMPLE 1 | HP | 300 | 850 | 2 | 98 |
| EXAMPLE 2 | HIP | 800 | 800 | 1 | 99 |
| EXAMPLE 3 | PRESS MOLDING, SINTERING | 1200 | 720 | 2 | 96 |
| EXAMPLE 4 | HP | 300 | 750 | 2 | 97 |
| EXAMPLE 5 | HIP | 1200 | 700 | 1 | 99 |
| EXAMPLE 6 | HP | 300 | 700 | 2 | 97 |
| EXAMPLE 7 | HP | 400 | 650 | 2 | 95 |
| EXAMPLE 8 | HIP | 1500 | 550 | 1.5 | 99 |
| EXAMPLE 9 | PRESS MOLDING, SINTERING | 1500 | 620 | 3 | 96 |
| EXAMPLE 10 | HP | 200 | 500 | 2 | 95 |
| EXAMPLE 11 | HIP | 1000 | 450 | 2 | 99 |
| EXAMPLE 12 | MELTING-CASTING QUENCHED DURING CASTING | | 1200 | ROLLING | 100 |
| EXAMPLE 13 | MELTING-CASTING QUENCHED DURING CASTING | | 1200 | NO ROLLING | 100 |
| EXAMPLE 14 | HIP | 1200 | 750 | 2 | 99 |
| EXAMPLE 15 | HP | 350 | 700 | 2 | 96 |
| EXAMPLE 16 | HP | 250 | 560 | 3 | 97 |
| EXAMPLE 17 | HIP | 1000 | 500 | 2 | 98 |
| EXAMPLE 18 | HP | 300 | 500 | 3 | 95 |

*1 PRESSURE DURING SINTERING IN HP OR HIP METHOD, PRESSING PRESSURE IN PRESSING MOLDING OR SINTERING METHOD
*2 MELTING TEMPERATURE (° C.) IN CASE OF MELTING CASTING
*3 PRESENCE/ABSENCE OF ROLLING IN CASE OF CASTING

TABLE 4

| | SINTERING METHOD | *1 PRESSURE (kgf/cm²) | *2 SINTERING TEMPERATURE (° C.) | *3 SINTERING TIME (H) | TARGET DENSITY (%) |
|---|---|---|---|---|---|
| COMPARATIVE EXAMPLE 1 | HP | 300 | 550 | 2 | 97 |
| COMPARATIVE EXAMPLE 2 | HIP | 1000 | 700 | 1 | 98 |
| COMPARATIVE EXAMPLE 3 | PRESS MOLDING, SINTERING | 1200 | 880 | 5 | 96 |
| COMPARATIVE EXAMPLE 4 | CASTING-ROLLING, NO QUENCHING DURING CASTING | | 1150 | NO ROLLING | 100 |
| COMPARATIVE EXAMPLE 5 | HP | 150 | 800 | 6 | 96 |
| COMPARATIVE EXAMPLE 6 | HIP | 1200 | 700 | 1 | 98 |
| COMPARATIVE EXAMPLE 7 | MELTING-CASTING, QUENCHED DURING CASTING | | 1200 | NO ROLLING | 100 |
| COMPARATIVE EXAMPLE 8 | HP | 250 | 350 | 2 | 93 |
| COMPARATIVE EXAMPLE 9 | HP | 200 | 450 | 1 | 90 |
| COMPARATIVE EXAMPLE 10 | HIP | 1300 | 500 | 0.25 | 90 |
| COMPARATIVE EXAMPLE 11 | HP | 350 | 580 | 1 | 98 |
| COMPARATIVE EXAMPLE 12 | HP | 350 | 580 | 2 | 95 |
| COMPARATIVE EXAMPLE 13 | HP | 350 | 500 | 2 | 94 |

*1 PRESSURE DURING SINTERING IN HP OR HIP METHOD, PRESSING PRESSURE IN PRESSING MOLDING OR SINTERING METHOD
*2 MELTING TEMPERATURE (° C.) IN CASE OF MELTING CASTING
*3 PRESENCE/ABSENCE OF ROLLING IN CASE OF CASTING

TABLE 5

| | CONTENT (at %) BY ICP ANALYSIS | | | GRAIN DIAMETER (μm) OF METAL PHASE | INTERVENING Bi PHASE | |
|---|---|---|---|---|---|---|
| | Ga | Bi | Na | | PRESENCE/ ABSENCE | AVERAGE GRAIN DIAMETER (μm) |
| EXAMPLE 1 | 15.2 | 0.11 | — | 25 | PRESENT | 2 |
| EXAMPLE 2 | 18.7 | 0.45 | — | 10 | PRESENT | 1 |
| EXAMPLE 3 | 26.3 | 0.08 | — | 55 | PRESENT | 2 |
| EXAMPLE 4 | 25.4 | 2.9 | — | 22 | PRESENT | 1 |
| EXAMPLE 5 | 28.7 | 0.32 | — | 8 | PRESENT | 3 |
| EXAMPLE 6 | 30.0 | 1.00 | — | 29 | PRESENT | 0.5 |
| EXAMPLE 7 | 30.2 | 2.9 | — | 31 | PRESENT | 25 |
| EXAMPLE 8 | 34.0 | 2.1 | — | 12 | PRESENT | 39.2 |
| EXAMPLE 9 | 34.6 | 2.9 | — | 63 | PRESENT | 1 |
| EXAMPLE 10 | 40.0 | 4.9 | — | 27 | PRESENT | 5 |
| EXAMPLE 11 | 39.6 | 3 | — | 6 | PRESENT | 44.9 |
| EXAMPLE 12 | 24.0 | 0.32 | — | 72 | PRESENT | 5 |
| EXAMPLE 13 | 29.9 | 1.1 | — | 95 | PRESENT | 5 |
| EXAMPLE 14 | 21.0 | 0.48 | 0.5 | 8 | PRESENT | 61 |
| EXAMPLE 15 | 31.1 | 0.51 | 2.7 | 52 | PRESENT | 3 |
| EXAMPLE 16 | 35.4 | 0.53 | 9.97 | 43 | PRESENT | 3 |
| EXAMPLE 17 | 34.5 | 0.53 | 0.51 | 5 | PRESENT | 1 |
| EXAMPLE 18 | 39.1 | 0.46 | 0.48 | 32 | PRESENT | 1 |

| | INTERVENING Bi PHASE FEATURE | NUMBER OF PHASES | PRESENCE/ ABSENCE OF CHIPPING AFTER PROCESSING | SURFACE ROUGHNESS Ra (μm) | SURFACE ROUGHNESS Rz (μm) |
|---|---|---|---|---|---|
| EXAMPLE 1 | Bi SIMPLE SUBTANCE ONLY | 50 | ABSENT | 0.3 | 7.4 |
| EXAMPLE 2 | Bi AND $Cu_5Bi_2$ | 60 | ABSENT | 0.3 | 3.2 |
| EXAMPLE 3 | Bi SIMPLE SUBTANCE ONLY | 30 | ABSENT | 0.5 | 7.5 |
| EXAMPLE 4 | Bi AND $Cu_5Bi_2$ | 200 | ABSENT | 0.3 | 3.5 |
| EXAMPLE 5 | Bi AND $Cu_5Bi_2$ | 6 | ABSENT | 0.2 | 3.4 |
| EXAMPLE 6 | Bi AND $Cu_5Bi_2$ | 52 | ABSENT | 0.4 | 4.3 |
| EXAMPLE 7 | Bi AND $Cu_5Bi_2$ | 10 | ABSENT | 0.8 | 5.4 |
| EXAMPLE 8 | Bi AND $Cu_5Bi_2$ | 56 | ABSENT | 0.2 | 5.2 |
| EXAMPLE 9 | Bi AND $Cu_5Bi_2$ | 65 | ABSENT | 0.5 | 6.2 |
| EXAMPLE 10 | Bi AND $Cu_5Bi_2$ | 223 | ABSENT | 0.8 | 7.2 |
| EXAMPLE 11 | Bi AND $Cu_5Bi_2$ | 35 | ABSENT | 0.7 | 5.9 |
| EXAMPLE 12 | Bi SIMPLE SUBTANCE ONLY | 80 | ABSENT | 0.9 | 6.3 |
| EXAMPLE 13 | Bi SIMPLE SUBTANCE ONLY | 100 | ABSENT | 0.9 | 6.9 |
| EXAMPLE 14 | Bi AND $Cu_5Bi_2$ | 27 | ABSENT | 0.2 | 3.4 |
| EXAMPLE 15 | Bi AND $Cu_5Bi_2$ | 94 | ABSENT | 0.3 | 8.3 |
| EXAMPLE 16 | Bi AND $Cu_5Bi_2$ | 97 | ABSENT | 0.2 | 3.2 |
| EXAMPLE 17 | Bi AND $Cu_5Bi_2$ | 85 | ABSENT | 0.3 | 5.1 |
| EXAMPLE 18 | Bi AND $Cu_5Bi_2$ | 82 | ABSENT | 0.4 | 5.6 |

TABLE 6

| | CONTENT (at %) BY ICP ANALYSIS | | | GRAIN DIAMETER (μm) OF METAL PHASE | INTERVENING Bi PHASE | |
|---|---|---|---|---|---|---|
| | Ga | Bi | Na | | PRESENCE/ ABSENCE | AVERAGE GRAIN DIAMETER (μm) |
| COMPARATIVE EXAMPLE 1 | 34.9 | 0 | — | 10 | ABSENT | NONE |
| COMPARATIVE EXAMPLE 2 | 30.1 | 0 | — | 21 | ABSENT | NONE |
| COMPARATIVE EXAMPLE 3 | 25.1 | 0 | — | 98 | ABSENT | NONE |
| COMPARATIVE EXAMPLE 4 | 24.9 | 0 | — | 2900 | ABSENT | NONE |
| COMPARATIVE EXAMPLE 5 | 29.7 | 0.01 | — | 130 | PRESENT | 0.2 |

TABLE 6-continued

| | | | | | | |
|---|---|---|---|---|---|---|
| COMPARATIVE EXAMPLE 6 | 30.1 | 0.02 | — | 10 | PRESENT | 141 |
| COMPARATIVE EXAMPLE 7 | 29.8 | 0.01 | — | 3870 | PRESENT | 3 |
| COMPARATIVE EXAMPLE 8 | 34.8 | 6.6 | — | 18 | PRESENT | 6 |
| COMPARATIVE EXAMPLE 9 | 21.0 | 6.4 | 0.9 | 24 | PRESENT | 198 |
| COMPARATIVE EXAMPLE 10 | 35.0 | 0.07 | — | 19 | PRESENT | 0.2 |
| COMPARATIVE EXAMPLE 11 | 30.2 | 11.1 | — | 21 | PRESENT | 9 |
| COMPARATIVE EXAMPLE 12 | 35.1 | 0.05 | 1.8 | 16 | PRESENT | 24 |
| COMPARATIVE EXAMPLE 13 | 39.0 | 0.05 | 0.8 | 17 | PRESENT | 0.2 |

| | INTERVENING Bi PHASE | | | |
|---|---|---|---|---|
| | FEATURE | NUMBER OF PHASES | PRESENCE/ABSENCE OF CHIPPING AFTER PROCESSING | SURFACE ROUGHNESS Ra ($\mu$m) | SURFACE ROUGHNESS Rz ($\mu$m) |
| COMPARATIVE EXAMPLE 1 | NONE | NONE | EVALUCATION INTERRUPTED BECAUSE OF CRACKING DURING SURFACE PROCESSING | | |
| COMPARATIVE EXAMPLE 2 | NONE | NONE | EVALUCATION INTERRUPTED BECAUSE OF CRACKING DURING SURFACE PROCESSING | | |
| COMPARATIVE EXAMPLE 3 | NONE | NONE | PRESENT | 1.2 | 13 |
| COMPARATIVE EXAMPLE 4 | NONE | NONE | PRESENT | 2.3 | 28 |
| COMPARATIVE EXAMPLE 5 | Bi AND $Cu_5Bi_2$ | 2 | EVALUCATION INTERRUPTED BECAUSE OF CRACKING DURING PROCESSING | | |
| COMPARATIVE EXAMPLE 6 | Bi AND $Cu_5Bi_2$ | 82 | PRESENT | 1.9 | 14.1 |
| COMPARATIVE EXAMPLE 7 | Bi SIMPLE SUBTANCE ONLY | 1 | EVALUCATION INTERRUPTED BECAUSE OF CRACKING DURING PROCESSING | | |
| COMPARATIVE EXAMPLE 8 | Bi AND $Cu_5Bi_2$ | 187 | EVALUCATION INTERRUPTED BECAUSE OF LARGE AMOUNT OF CHIPPING DURING OUTER PERIPHERAL PROCESSING | | |
| COMPARATIVE EXAMPLE 9 | Bi AND $Cu_5Bi_2$ | 19 | EVALUCATION INTERRUPTED BECAUSE OF LARGE AMOUNT OF CHIPPING DURING OUTER PERIPHERAL PROCESSING | | |
| COMPARATIVE EXAMPLE 10 | Bi AND $Cu_5Bi_2$ | 1 | EVALUCATION INTERRUPTED BECAUSE OF CRACKING DURING SURFACE PROCESSING | | |
| COMPARATIVE EXAMPLE 11 | Bi AND $Cu_5Bi_2$ | 260 | EVALUCATION INTERRUPTED BECAUSE OF CRACKING DURING OUTER PERIPHERAL PROCESSING | | |
| COMPARATIVE EXAMPLE 12 | Bi AND $Cu_5Bi_2$ | 2 | EVALUCATION INTERRUPTED BECAUSE OF CRACKING DURING SURFACE PROCESSING | | |
| COMPARATIVE EXAMPLE 13 | Bi AND $Cu_5Bi_2$ | 1 | EVALUCATION INTERRUPTED BECAUSE OF CRACKING DURING SURFACE PROCESSING | | |

As can be seen from these evaluation results, in Comparative Examples 1 to 4 in which Bi is not added or the amount of Bi added is less than the content of Bi in the present invention and Comparative Example 6 in which the amount of Bi added is greater than the content of Bi in the present invention, the surface roughness Ra was 1.0 $\mu$m or greater and the surface roughness Rz was 10.1 $\mu$m or greater after processing, whereas in Examples 1 to 18 of the present invention in which the effective amount of Bi is added, no chipping occurred after processing, the surface roughness Ra was 0.8 $\mu$m or less, and the surface roughness Rz was 7.2 $\mu$m or less, resulting in obtaining excellent machinability. While, the sputtering targets in all Examples exhibited excellent processability, in Comparative Examples 5, 7, 10, 12, and 13 in which the amount of Bi added is less than the content of Bi in the present invention and Comparative Examples 8, 9, and 11 in which the amount of Bi added is greater than the content of Bi in the present invention, chipping or cracking occurred on these sputtering targets during processing and thus these sputtering targets could not undergo intended processing.

Figure 2:
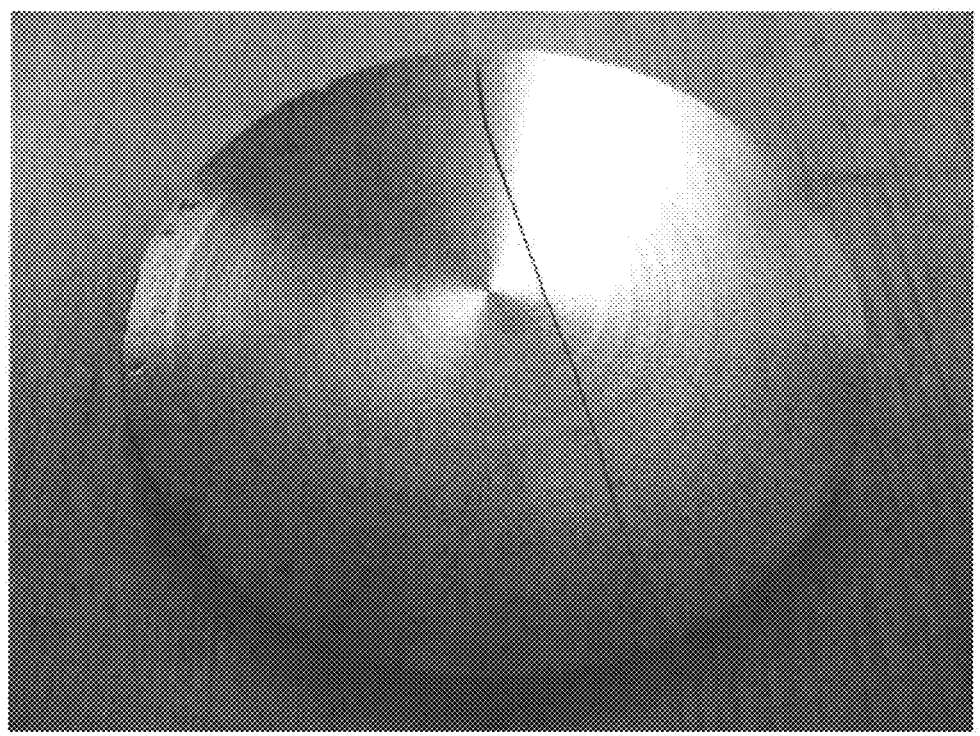
FIG. 2 is a photograph illustrating the processed target surface in Comparative Example 5 of the sputtering target and the method for producing the same according to the present invention.

As an example, the photographs of the processed target surfaces in Example 6 of the present invention in which the composition of Cu, Ga, and Bi was $Cu_{69}Ga_{30}Bi_1$ (at %) and in Comparative Example 5 of the present invention in which the composition of Cu, Ga, and Bi was $Cu_{69.9}Ga_{29.7}Bi_{0.01}$ (at %) are shown in FIGS. 1 and 2.

Figure 3:
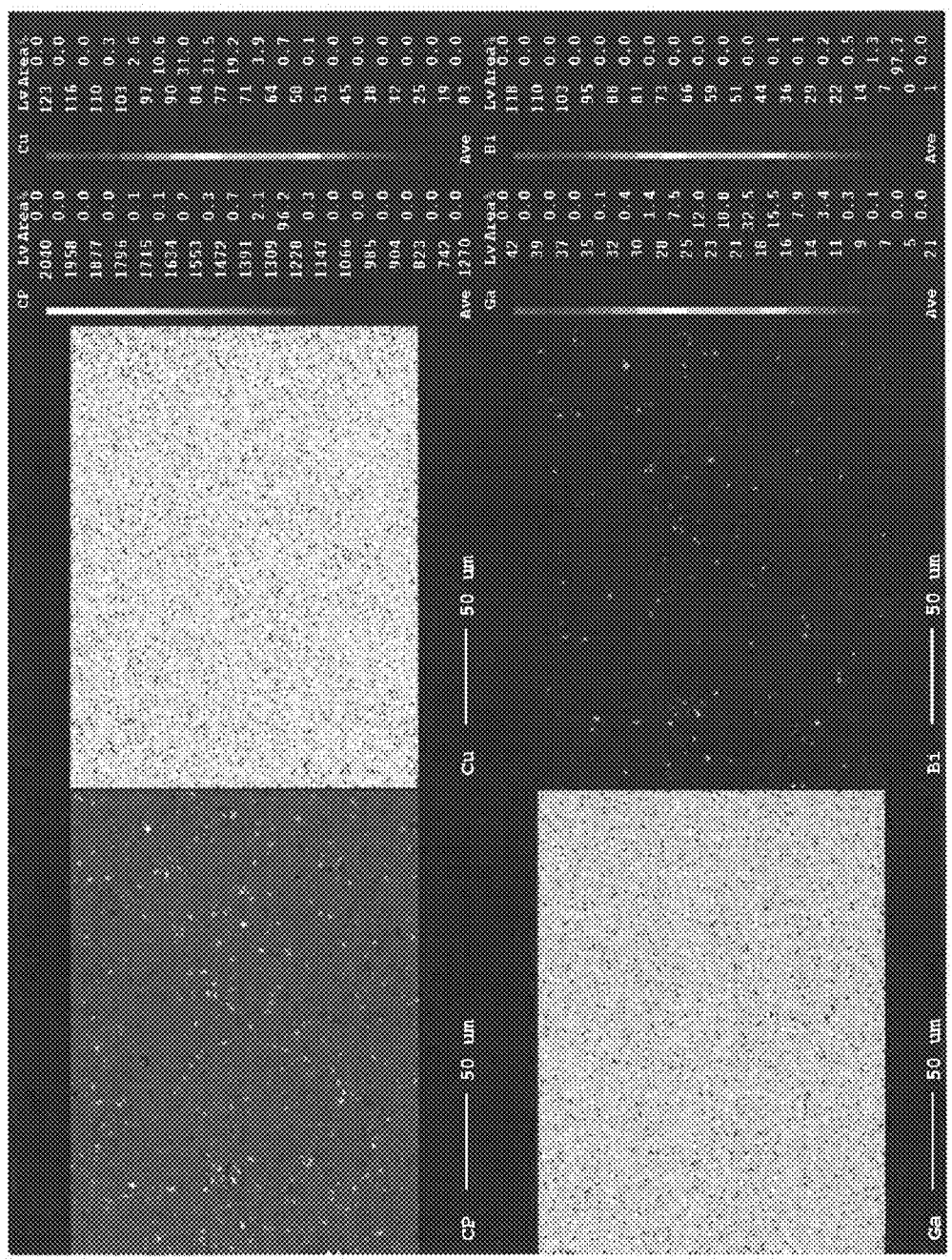
FIG. 3 is a photograph illustrating a component image (COMP image), a Cu element mapping image, a Ga element mapping image, and a Bi element mapping image obtained by an electron probe microanalyzer (EPMA) in Example 6 of the present invention.

As can be seen from structure observation results, the number of intervening Bi phases in any one of Examples 1 to 18 of the present invention was six or greater, resulting in a distribution of Bi in the structure. As an example, element distribution mapping images, which were obtained by EPMA, in Example 6 of the present invention in which the composition of Cu, Ga, and Bi was $Cu_{69}Ga_{30}Bi_1$ (at %) were shown in FIG. 3. All of the original images of these EPMA images were color images but were converted into monochromatic images by gray scale. The content of Cu, Ga, and Bi tends to be high as the brightness increases.

Note that the obtained sputtering targets had a high density of 95% or greater in all of Examples of the present invention.

The technical scope of the present invention is not limited to the aforementioned embodiments and Examples, but the present invention may be modified in various ways without departing from the scope or teaching of the present invention.

What is claimed is:

1. A sputtering target for producing a solar cell having a component composition containing:
   15 to 40 at % of Ga;
   0.1 to 5 at % of Bi; and
   the balance composed of Cu and unavoidable impurities with respect to all metal elements in the sputtering target, wherein
   the sputtering target has a Bi-containing phase within crystal grains or at grain boundaries of an alloy phase mainly containing a Cu—Ga alloy,
   the Bi-containing phase contains at least one of a Bi simple substance or an intermetallic compound containing 10 at % or greater of Bi,
   the sputtering target has a density of 95% or greater, and
   the average grain diameter of the Bi-containing phase is from 0.5 μm through 80 μm.

2. The sputtering target according to claim 1, wherein the intermetallic compound containing 10 at % or greater of Bi contains $Cu_5Bi_2$.

3. The sputtering target according to claim 1, wherein the average grain diameter of the metal phase in the sputtering target material is 100 μm or less.

4. A sputtering target for producing a solar cell having a component composition containing:
   15 to 40 at % of Ga;
   0.1 to 5 at % of Bi;
   0.05 to 15 at % of Na; and
   the balance composed of Cu and unavoidable impurities with respect to all metal elements in the sputtering target, wherein
   Na is contained as an NaF compound, an $Na_2S$ compound, or an $Na_2Se$ compound, and
   the sputtering target has a Bi-containing phase within crystal grains or at grain boundaries of an alloy phase mainly containing a Cu—Ga alloy,
   the Bi-containing phase contains at least one of a Bi simple substance or an intermetallic compound containing 10 at % or greater of Bi,
   the sputtering target has a density of 95% or greater, and
   the average grain diameter of the Bi-containing phase is from 0.5 μm through 80 μm.

5. A method for producing the sputtering target according to claim 1, the method comprising:
   a step of melting at least Cu, Ga and Bi as simple substances or an alloy that contains two or more of these elements at 1,050° C. or higher to produce an ingot.

6. A method for producing the sputtering target according to claim 1, the method comprising:
   a step of producing a starting material powder that is obtained by pulverizing at least Cu, Ga and Bi as simple substances or an alloy that contains two or more of these elements; and
   a step of subjecting the starting material powder to hot processing in a vacuum, in an inert atmosphere or in a reducing atmosphere,
   wherein Ga contained in the starting material powder is contained in the form of a Cu—Ga alloy or in the form of a Ga—Bi alloy.

7. A method for producing the sputtering target according to claim 4, the method comprising:
   a step of producing a starting material powder that is obtained by preparing at least Cu, Ga and Bi as simple substances or an alloy that contains two or more of these.

* * * * *